United States Patent [19]

Tomkiewicz

[11] 4,060,295

[45] Nov. 29, 1977

[54] ZERO INSERTION FORCE PRINTED CIRCUIT BOARD EDGE CONNECTOR ASSEMBLY

[75] Inventor: Thaddeus K. Tomkiewicz, Bolingbrook, Ill.

[73] Assignee: Molex Incorporated, Lisle, Ill.

[21] Appl. No.: 666,769

[22] Filed: Mar. 15, 1976

[51] Int. Cl.$^2$ .............................................. H05K 1/12

[52] U.S. Cl. ............................ 339/17 LC; 339/17 F; 339/75 M; 339/176 MF

[58] Field of Search .............. 339/17 F, 17 L, 17 LC, 339/175 R, 175 M, 175 MP, 91 R, 176 MP, 176 MF

[56] References Cited

U.S. PATENT DOCUMENTS

| | | | |
|---|---|---|---|
| 2,928,063 | 3/1960 | Gammel | 339/176 MP X |
| 3,283,291 | 11/1966 | Krol et al. | 339/176 MP |
| 3,701,071 | 10/1972 | Landman | 339/91 R X |
| 3,795,888 | 3/1974 | Nardo et al. | 339/176 MP |
| 3,848,952 | 11/1974 | Tighe | 339/125 R X |
| 3,851,294 | 11/1974 | Palazzetti et al. | 339/17 F |
| 3,920,303 | 11/1975 | Pittman et al. | 339/176 MP X |

*Primary Examiner*—Roy Lake
*Assistant Examiner*—E. F. Desmond
*Attorney, Agent, or Firm*—Louis A. Hecht

[57] ABSTRACT

An edge connector assembly for effecting electrical connection to a plurality of connection tabs arranged along and adjacent an edge of an inserted printed circuit board. The connector assembly generally includes an insulated housing and a plurality of like spring terminals mounted in the housing. Each terminal has a contact portion engaging a connection tab. The housing includes a first wall having a front portion overlying the board and a rear portion. A second wall is parallel to and spaced from the first wall and is joined to the rear portion thereof. A lip support extends from the second wall canted away from the first wall. An edge receiving slot is defined between the lip support and the overlying portion of the first wall for receiving the edge of the board therein. A plurality of terminal receiving cavities are formed between the first and second walls, each cavity including terminal mounting means on the first wall for mounting the terminals so that the contact portion thereof is disposed in the edge receiving slot for engagement with the connection tabs. The board is rotatable within the edge receiving slot from a non-engaging position wherein the contact portions are spaced from the connection tabs to a mounted position where the contact portions are engaging the connection tabs. Locking means are formed on the overlying portion of the first wall for cooperating with the board for holding the board in the mounted position.

1 Claim, 5 Drawing Figures

ZERO INSERTION FORCE PRINTED CIRCUIT BOARD EDGE CONNECTOR ASSEMBLY

BACKGROUND OF THE INVENTION

1. Field of the Invention

The present invention relates to a zero insertion force electrical connector assembly for making edge connection with printed circuit boards and the like.

2. Brief Description of the Prior Art

Conventional printed circuit wiring techniques have given rise to the adoption of special electrical connector devices, one specie of which may be referred to as edge connectors. Edge connectors generally comprise a support frame or housing with an opening of one sort or another for receiving a portion, or edge, of the associated printed circuit board therein. The connector assembly customarily includes a plurality of terminals arranged in some manner such that upon insertion of the printed circuit board, electrical continuity is effectively established between the connector terminals and the conducting tabs or strips defined in the board. Usually these terminals are spring-loaded or otherwise resiliently pressed against the printed circuit board being inserted in the connector housing so that an appropriate contact force is developed to hold the board and connector togeter as a composite unit. Further, the force developed must be of such magnitude to ensure that a sufficiently low resistance connection is established and maintained between th printed circuit board conductive strips or tabs and the resilient terminals of the connector assembly itself.

As a consequence of this relatively high contact pressure, a wear problem more often than not develops regarding the contact surfaces on the terminal and/or the associated printed circuit board conductive surfaces. Moreover, it is often difficult to insert and properly align the printed circuit board within the connector housing in the face of this inherent clamping force. The board frequently becomes wedged in a sidewise position and considerable effort and time is often required to effect its removal and reinsertion in the required correct alignment.

Still another difficulty is frequently encountered due to the lack of uniformity in the thickness dimensions of such printed circuit boards. An increase in the thickness of such boards will result in still higher contact or clamping forces exerted and further compound problems. A decrease in the board thickness past a given point simply will not generate the required low resistance connection.

U.S. Pat. No. 3,795,888, discloses an edge connector of the general type above described. However, the configuration disclosed therein does not provide a stable relationship between the connector assembly and the printed circuit board. The reason for that is because the printed circuit board is cantilevered outwardly from the connector assembly and offers no resistance to a board pull out force.

U.S. Pat. Nos. 3,701,071 and 3,848,952 disclose edge connectors which offer a greater stability than the connector disclosed in U.S. Pat. No. 3,795,888. The reason for this additional stability is due to separate board supporting member which can prove to be expensive, as well as cumbersome.

In addition to the above problems, there is also the desirability of stacking th connectors, i.e., the ability of mounting a plurality of connector assemblies along an edge in very close proximity to one another so that the progression distance between terminals of adjacent connector assemblies is constant. None of the edge connector assemblies disclosed in the above identified patents offers or discloses any stackability feature.

SUMMARY OF THE INVENTION

It is therefore the principal object of the present invention to provide an edge connector assembly for effecting a high pressure, non-sliding, electrical connection to a plurality of connection tabs arranged along and adjacent an edge of a printed circuit board. A further object of the present invention is to provide an edge connector assembly design of the type described that can be mounted on the printed circuit board in close proximity to one another to provide stackability.

These and other objects of the invention are accomplished by one form of the invention currently contemplated which provides for an insulation housing and a plurality of like spring terminals mounted in the housing. Each terminal has a contact portion engaging a connection tab. The housing includes an edge receiving slot for receiving the edge of the board therein and is defined between a portion for overlying the board and board support means canted away from said overlying portion and adapted to underlie said board. The terminals are mounted so that the contact portions thereof are disposed in the edge receiving slot for engagement with the connection tabs. The board is rotatable within the edge receiving slot from a non-engaging position wherein the contact portions are spaced from the connection tabs to a mounted position wherein the contact portions are engaging the connection tabs. Locking means is formed on the overlying portion for holding the board in the mounted position. The locking means includes vertically disposed hook means for penetrating the board and engaging the underside thereof.

In order to achieve stackability, the board includes a pair of aperture means spaced from the edge, and said hook means includes a pair of resilient hooks formed on opposite sides of the overlying portion for penetrating the aperture means. The hooks are canted toward each other and are resiliently movable away from each other for removal from the aperture means. Each hook is staggered with respect to one another on opposite sides of the housing so that adjacent hooks of adjacent connector assemblies can be linearly aligned and received into the same aperture means.

DESCRIPTION OF THE PREFERRED EMBODIMENT

Figure 1:
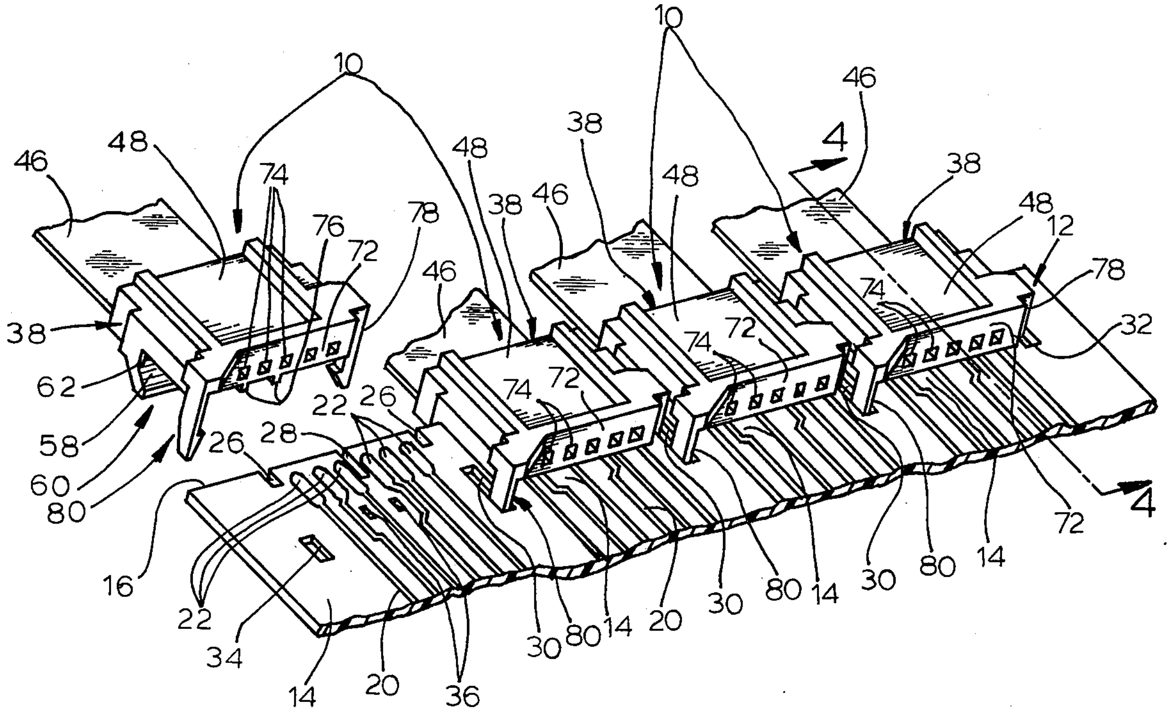
FIG. 1 is a perspective view of a circuit assembly employing the connector assemblies of the present invention.

Turning now to FIG. 1, the connector assembly of the present invention, generally designated 10, is seen mounted on a printed circuit board, generally designated 12. The printed circuit board 12 has a number of connector mounting areas, generally designated 14, whereat the connector assembly 10 is adapted to be mounted. The connector mounting areas 14 are arranged along an edge 16 of the board.

For ease of discussion, each connector mounting area 14 has a top surface 18 with printed circuitry 20 thereon terminating with a plurality of connection tabs 22 near the edge 16. The connector mounting area 14 also has a bottom surface 24.

Prior to mounting the connector assembly 10 on the printed circuit board 12, a number of fabrication steps are performed on the board. Each connector mounting area 14 has two spaced apart key slots 26 formed from the edge 16 inwardly. A third key slot 28 is formed intermediate slots 26 and extends a greater distance inwardly than slots 26.

A plurality of elongated mounting apertures 30 are formed in the board 12 spaced from the edge 16. Each elongated mounting aperture 30 is generally at the border between adjacent connector mounting areas 14. A shorter mounting aperture 32 is formed in the board 12 spaced from the edge 16 at one end of all of the connector mounting areas 14. At the other end of all the connector mounting areas 14, another mounting aperture 34 is formed of the same size as aperture 32 but spaced a greater distace from the edge 16.

A pair of polarizing apertures 36 are formed in each connector mounting area 14 for reasons which will become more apparent hereinafter.

Figure 2:
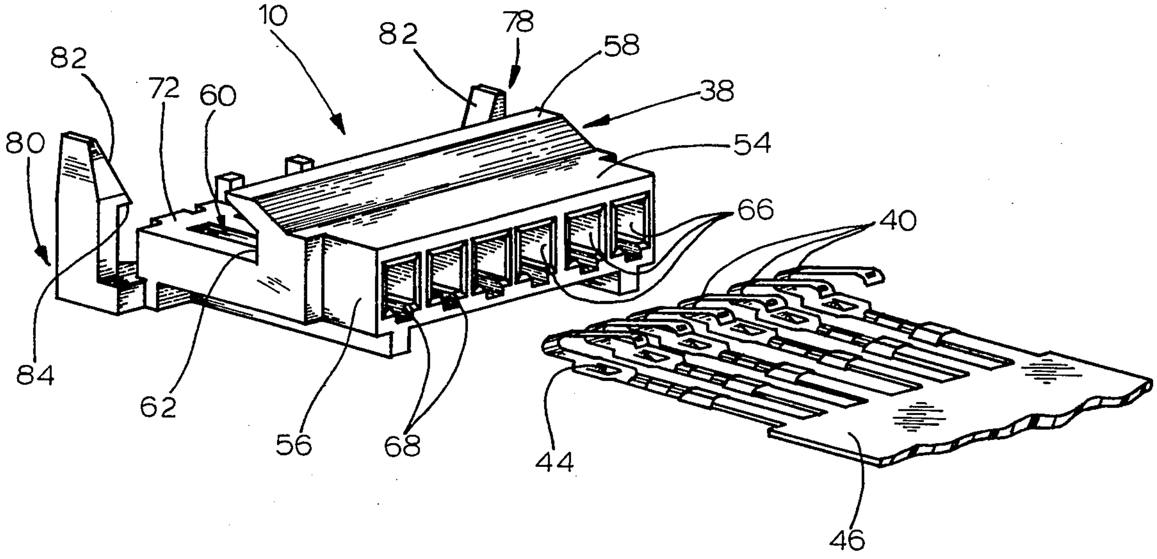
FIG. 2 is an exploded perspective view of the connector assembly of the present invention.

Turning now to FIG. 2, the connector assembly 10 of the present invention is seen to generally include a housing, generally designated 38, made of insulation material and a plurality of like spring terminals, each generally designated 40, for mounting within the housing. Each terminal 40 is generally U-shaped in configuration having a contact portion with a male nib 42 (FIG. 3) adopted to engage the connection tab 22. A locking tang 44 (FIGS. 2 and 4) is formed on the other side of the terminal 40.

The terminals 40 are crimped onto a wire harness 46 in the conventional manner. The wire harness 46 can either be a plurality of discrete wires or a ribbon cable harness, as depicted in the drawings.

Figure 5:
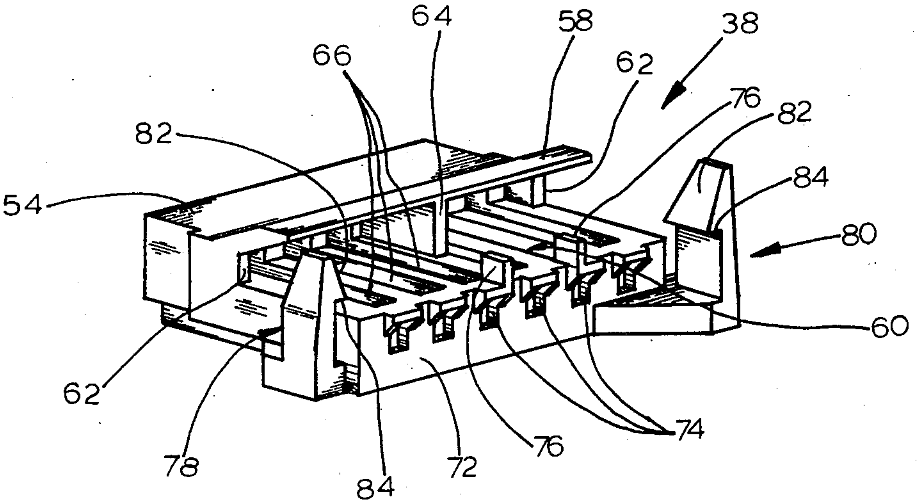
FIG. 5 is a perspective view of an empty housing of the connector assembly of the present invention.

Turning to FIG. 5, the housing 38 is seen to generally include an upper wall, generally designated 48, having a front portion 50 adapted to overlie the connector mounting area 14 and a rear portion 52. A lower second wall 54 is provided parallel to and spaced from the upper wall 48 and joined to the rear portion 52 by means of two vertical side walls 56.

A board support lip 58 extends from the lower wall 54 canted away from the upper wall 48 underlying the front portion 50 of upper wall 48. When the connector assembly 10 is mounted on the board 12, the support lip 58 underlies the board. Accordingly, an edge receiving slot 60 is defined between the lip support 58 and the overlying front portion 50 of upper wall 48.

In order to aid in the mounting of the connector assembly 10 and to polarize the assembly with respect to the board 12, two vertical web portions 62 extend from side walls 56 joining the support lip 56 and the upper wall 48 and a third web portion 64 is formed intermediate web 62 joining the lip support 58 with the upper wall 48. Web portion 64 extends a further distance forward than web portions 62. Web portions 62 and 64 are adapted to be received within slots 26 and 28, respectively, when the board 12 is received within the edge receiving slot 60.

A plurality of terminal receiving cavities, generally designated 66, are formed between upper wall 48 and lower wall 54 for receiving terminals 40 therein. The terminals 40 are mounted within the cavity 66 by means of a channel 68 formed along the length of upper wall 48. Each channel 68 has a stop shoulder 70 formed therein.

A front ledge 72 which extends downwardly from the front portion 50 of the upper wall 48 defines furthermost extension of each terminal receiving cavity 66. Openings 74 are provided in the ledge 72, one for each cavity 66, allowing communication with each channel 68.

The terminals 40 and the attached wire harness 46 are inserted into the connector housing 38 by inserting the terminal 40 through the rear end of a respective cavity 66. The terminal 40 is pushed until it abuts the front ledge 72. When in this position, the terminal 40 is fully inserted and cannot be accidentally withdrawn because the locking tang 44 abuts the stop shoulder 70.

Figure 3:
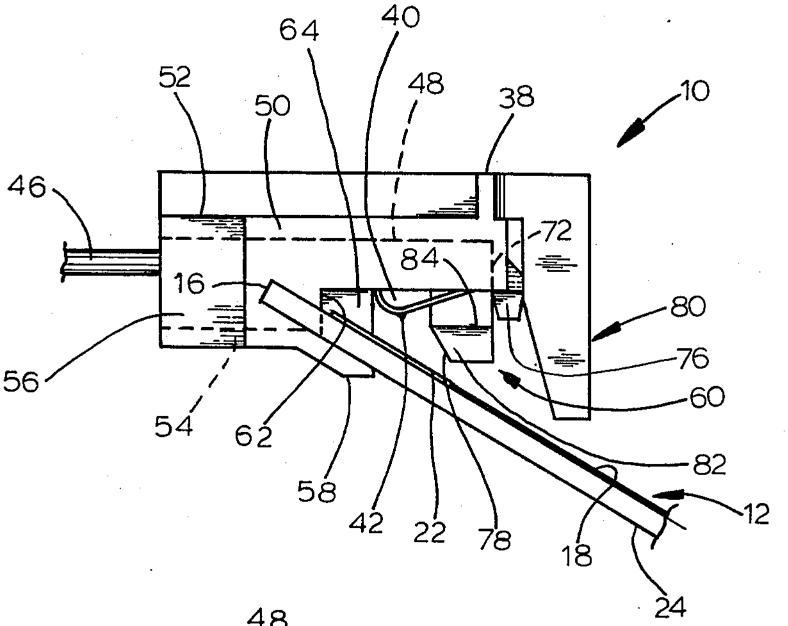
FIG. 3 is a side elevation of the connector assembly of the present invention preparatory to mounting on a printed circuit board.
Figure 4:
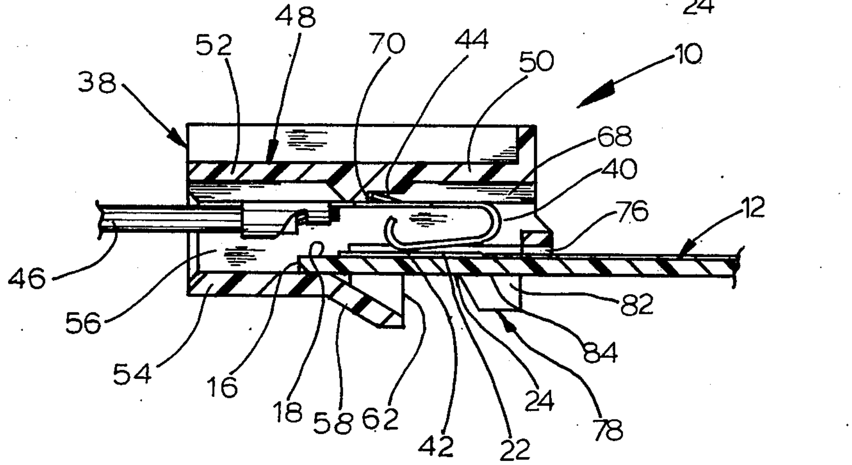
FIG. 4 is a sectional view taken generally along the line 4-4 of FIG. 1.

The male nibs 42 of each terminal 40 are disposed downwardly in the edge receiving slot 60 when fully inserted as best shown in FIGS. 3 and 4. In case withdrawal of a terminal 40 is desired, a thin elongated tool (not shown) can be inserted through the front ledge opening 74 (FIG. 4) to engage the locking tang 44 so that the locking tang is lifted above the stop shoulder 70 to permit withdrawal.

Front ledge 72 is also provided with a pair of polarizing pins 76 which extend downwardly therefrom. The pins 76 are adapted to be received within the polarizing apertures 36 when the connector assembly 10 is mounted on the board 12.

Locking means in the form of two resilient hooks 78 and 80 are formed on the front portion 50 of the upper wall 48. Hooks 78 and 80 are disposed downwardly and are staggered with respect to one another, i.e., hook 78 is disposed on one side of the upper wall 48 a given distance from the rear portion 52 whereas hook 80 is disposed a greater distance forward of the rear portion 52. In addition, the hooks 78 and 80 are molded so that they are slightly canted toward one another. Each hook 78 and 80 has a cam portion 82 and an underside engaging portion 84. The hooks 78 and 80 are adapted to penetrate two of the mounting apertures 30, 32, or 34, as will be discussed in greater detail hereinafter.

In order to mount the connector assembly 10 onto the printed circuit board 12, the connector assembly is placed so that the edge 16 of the board 12 is received within the edge receiving slot 60 in a non-engaging position as depicted in FIG. 3. In the non-engaging position, the webs 62 and 64 are received in key slots 26 and 28, respectively, the bottom surface of the board 12 engages the support lip 58 so that the connector assembly 10 is at an angle relative to the board 12, the male nibs 42 of the terminals 40 are spaced from the connection tabs 22, and the mounting hooks 78 and 80 are spaced from the top surface 18 of the board 12.

The connector assembly 10 is then rotated, using the edge 16 as a fulcrum, toward the top surface 18 of the board 12 to a mounted position as best shown in FIGS. 1 and 5. When moving from the non-engaging position to the mounted position, the cam portions 82 of hooks 78 and 80 engage its respective mounting aperture 30, 32 or 34 which serves to cam the hooks 78 and 80 away from one another. Upon further penetration of the hooks 78 and 80, the cam portions 82 thereof will extend past the board 12 causing the hooks to snap inwardly toward one another. When this occurs, portions 84 will engage the bottom surface 24 of board 12. Accidental withdrawal of the hooks 78 and 80 is prevented because of the inward bias produced.

When in the mounted position, as above described, the male nibs 42 are brought into substantially vertical engagement with the connection tabs 22 thereby preventing any sliding interface as well as providing a zero insertion force effect. In addition, due to the resilient formation of the terminals 40, the male nibs 42 will tend to dig into the connection tabs 22 to provide the type of connection required in this type of application.

Because of the staggering of mounting hooks 78 and 80 and the configuration of apertures 30, 32 and 34, the connector assemblies 10 of the present invention can be stacked with respect to one another. As best seen in FIG. 1, hook 78 of one connector assembly 10 and hook 80 of an adjacent connector assembly 10 are linearly aligned with respect to one another so that both are able to fit within the elongated slot 30. Mounting hook 78 of the connector assembly 10 on one end is received within mounting aperture 32 whereas mounting hook 80 of the connector assembly 10 on the other end is received within mounting aperture 34. By this arrangement, a relatively large number of connector assemblies 10 can be mounted on the printed circuit board 12 in a relatively short amount of space with the same spacing between terminals 40.

I claim:

1. A circuit assembly comprising:

a printed circuit board including an edge and a plurality of adjacent connector mounting areas at and near said edge, each connector mounting area having a top surface with a group of connection tabs arranged along the edge, a bottom surface, and aperture means spaced from the edge; and a plurality of connector assemblies each mounted on a connector mounting area, each connector assembly including an insulated housing and a plurality of like spring terminals mounted in the housing for engaging a connection tab, said housing including an edge receiving slot for receiving the edge of the board therein, said board being rotatable within said edge receiving slot from a non-engaging position wherein the terminals are spaced from the connection tabs to a mounted position wherein the contact portions are engaging the connection tabs, and two hook means formed on the overlying portion of the connector assembly for penetrating the aperture means and engaging the bottom surface of the respective connector mounting area for holding the board in the mounted position, said hook means being staggered so that the hook means on one connector assembly and the hook means on an adjacent connector assembly can be linearly aligned so that both hook means can be mounted in the same aperture means.

* * * * *